United States Patent [19]

Taber

[11] Patent Number: 4,647,857
[45] Date of Patent: Mar. 3, 1987

[54] FLOW MEASUREMENT USING NUCLEAR MAGNETIC RESONANCE

[75] Inventor: Michael A. Taber, Palo Alto, Calif.

[73] Assignee: Stanford University

[21] Appl. No.: 663,542

[22] Filed: Oct. 22, 1984

[51] Int. Cl.$^4$ .......................................... G01R 33/20
[52] U.S. Cl. .................................. 324/309; 324/312; 324/313
[58] Field of Search ............... 324/300, 307, 309, 312, 324/314, 318, 322, 306

[56] References Cited

U.S. PATENT DOCUMENTS

| | | | |
|---|---|---|---|
| 4,115,730 | 9/1978 | Mansfield | 324/312 |
| 4,165,479 | 8/1979 | Mansfield | 324/313 |
| 4,509,015 | 4/1985 | Ordidge | 324/309 |
| 4,516,075 | 5/1985 | Moran | 324/309 |
| 4,516,582 | 5/1985 | Redington | 324/309 |
| 4,523,596 | 6/1985 | Macovski | 324/309 |
| 4,528,985 | 7/1985 | Macovski | 324/309 |
| 4,532,473 | 7/1985 | Wehrli | 324/309 |
| 4,532,474 | 7/1985 | Edelstein | 324/312 |

Primary Examiner—Michael J. Tokar
Attorney, Agent, or Firm—Flehr, Hohbach, Test, Albritton & Herbert

[57] ABSTRACT

A modified spin echo sequence is employed to identify fluid movement in a material. The volume of interest is subjected to a static field along one axis (Z) and an RF magnetic excitation pulse transverse to the static field is applied which tilts the nuclear spins in the volume. The tilted nuclear spins are then allowed to precess about the uniform static field in the presence of a gradient field whereby the nuclear spins become dephased. Thereafter, a spin echo of the static spins is created by either a 180° RF pulse or reversal of the gradient field. Upon refocusing of the static nuclear spins a restoration RF pulse is applied to realign the stationary nuclear spins with the static field. Nuclear spins undergoing bulk motion as in fluid flow will be refocused to a different phase than the stationary spins so that the final RF pulse will in general leave these spins with a non-zero transverse magnetic moment. This residual transverse magnetic moment is then detected to identify the fluid movement.

12 Claims, 16 Drawing Figures

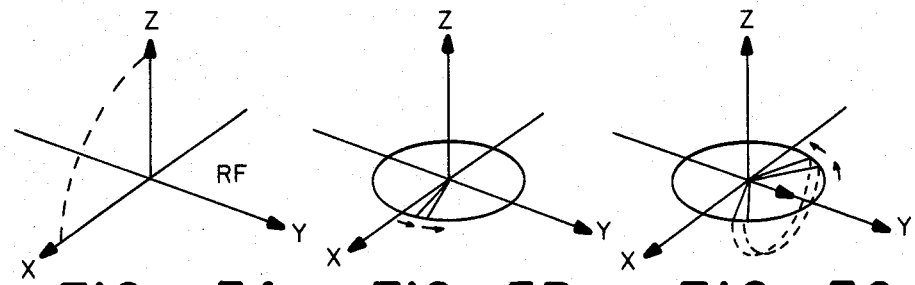
FIG.—3A  FIG.—3B  FIG.—3C
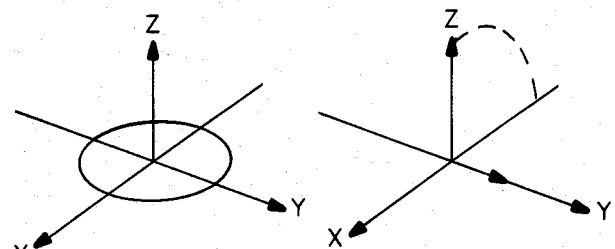
FIG.—3D  FIG.—3E
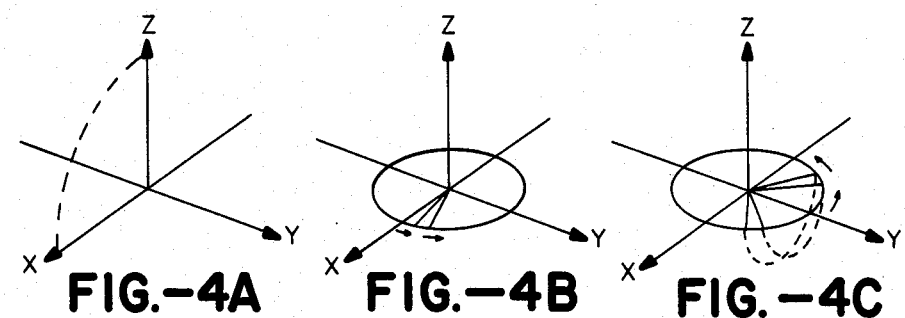
FIG.—4A  FIG.—4B  FIG.—4C
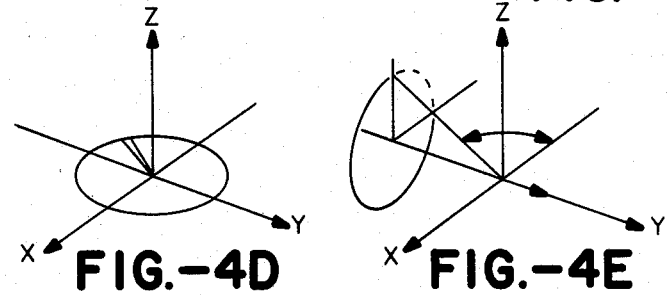
FIG.—4D  FIG.—4E
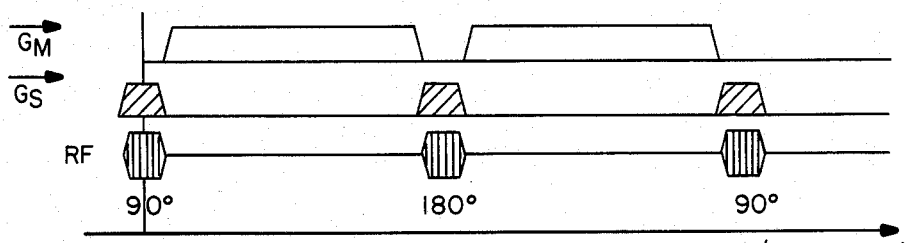
FIG.—5

FLOW MEASUREMENT USING NUCLEAR MAGNETIC RESONANCE

This invention relates generally to nuclear magnetic resonance (NMR) technology, and more particularly the invention relates to flow measurements such as blood flow measurements using NMR techniques.

Nuclear magnetic resonance is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio frequency signals resulting from the precession of these spins are received using pickup coils. By manipulating the magnetic fields, an array of signals are provided representing different regions of the volume. These are combined to produce a volumetric image of the nuclear spin density of the body.

A descriptive series of papers on NMR appeared in the June 1980 issue of the *IEEE Transactions on Nuclear Science*, Vol. NS-27, pp. 1220–1255. The basic concepts are described in the lead article, "Introduction to the Principles of NMR" by W. V. House, pp. 1220–1226, which employ computer tomography reconstruction concepts for reconstructing cross-sectional images. A number of two and three-dimensional imaging methods are described. Medical applications of NMR are discussed by Pykett in "NMR Imaging in Medicine", *Scientific American*, May 1982, pp. 78–88 and by Mansfield and Morris, *NMR Imaging in Biomedicine*, Academic Press, New York, 1982.

Briefly, a strong static magnetic field is employed to line up atoms whose nuclei have an odd number of protons and/or neutrons, that is, have both spin angular momentum and a magnetic dipole moment. A second RF magnetic field applied as a single pulse transverse to the first, is then used to pump energy into these nuclei, flipping them over, for example to 90° to 180°. After excitation the nuclei gradually return to alignment with the static field and give up the energy in the form of weak but detectable free induction decay (FID) electromagnetic waves. These FID signals are used by a computer to produce images.

The excitation frequency, and the FID frequency, is defined by the Larmor relationship which states that the angular frequency $\omega_o$, of the precession of the nuclei is the product of the magnetic field, $B_o$, and the socalled magnetogyric ratio, $\gamma$, a fundamental physical constant for each nuclear species:

$$\omega_o = B_o \cdot \gamma$$

Accordingly, by superimposing a linear gradient field, $B_z = z \cdot G_z$, on the static uniform field, $B_o$, which defines the Z axis, for example, nuclei in a selected X-Y plane can be excited by proper choice of the frequency of the transverse excitation field applied along the X or Y axis. Similarly, a gradient field can be applied in the X-Y plane during detection of the FID signals to spatially locate the FID signals in the plane.

The use of NMR for measuring blood flow and flow in other liquid systems has heretofore been proposed. Generally, these proposed techniques employ a tracer approach in which the nuclei spin system is inhomogeneously excited for the purpose of serving as a marker.

Subsequent motion of the spins may then be detected by making an NMR measurement in the same or different region. For example, Singer has developed several techniques making use of this approach. In one case, the effect of flow on apparent longitudinal relaxation time, $T_1$, is utilized. In this technique the spins are locally saturated or inverted by a small rf coil surrounding the tube containing the flowing liquid. After some period later, a 90° pulse is applied to measure $M_z(\tau)$, and an apparent $T_1$ is inferred. The value of $M_z(\tau)$ that is obtained depends on the rate in which unperturbed spins flow into the rf coil as well as on the real $T_1$. By comparing real and apparatus $T_1$, one can infer the fluid velocity provided that it falls in a suitable range. In a second approach two physically separated coils are employed, an upstream coil to periodically perturb the spins and a downstream coil to sense the passage of those spins by a change in the amplitude of the NMR signal.

An altenative to the tracer approach is a spin echo technique first proposed by Hahn, *Journal of Geophysical Research*, 65, 776, (1968), who was interested in a technique to measure the velocity of seawater. Hahn analyzed the effect of macroscopic motion on a standard spin echo experiment where the rf excitation is assumed to be homogeneous. The key result is that provided a linear gradient is used, a normal echo is produced at time $2\tau$ except that the azimuthal angle to which the spins reconverge in the rotating frame will be shifted by an amount $|\Delta\phi\{=\gamma(G\cdot V)\tau^2$ where G=grad $B_Z$ is the magnetic gradient vector and v is the flow velocity. Thus, if the phase shift is measured by phase-sensitively detecting the echo signal with respect to the phase of a stationary sample, a value for the component of flow velocity in the direction of the gradient can be obtained.

The present invention employs a modified spin echo sequence which can be adapted for use with a variety of imaging techniques. Briefly, the volume or plane of interest in subjected to a static field along one axis (z). If a planar slice is to be selectively excited then a gradient field will be superimposed on the static field. An RF magnetic excitation pulse transverse to the static field is then applied which tilts the nuclear spins in the volume or plane of interest. The excitation is preferably applied along a transverse axis (i.e. 90° from the static field axis) but can be at another angle. The tilted nuclear spins are then allowed to precess for another period, $\tau$, about the static field axis in the presence of a gradient field whereby the nuclear spins become dephased. The time, $\tau$, is selected to be less than the transverse relaxation time. The spins may now be refocused back into a coherent state to form what is known as a spin echo. This can be accomplished in either of two ways. One way is to apply an 180° RF pulse at time $\tau$ which has the effect of shifting the spin phases into a mirror image position with respect to the phase of the RF field. Under the continuing effect of the gradient the spins will reconverge at time $2\tau$ to form a spin echo. The second way is to reverse the gradient field so that the local field is changed from $B_o + B_z$ to $B_o - B_z$, where $B_z$ is z component of the local gradient field. This has the effect of reversing the local direction of precession (as viewed from the rotating frame) so that the spins will again produce a spin echo at time $2\tau$. Both stationary and moving spins will produce a spin echo, but as noted above, the moving spins wil reconverge with a shifted phase (azimuthal angle) with respect to the stationary spins. If a final RF pulse is now applied at time $2\tau$ under conditions identical to the initial excitation pulse, the stationary spins will then become realigned with the static field and will no longer precess. Because of their shifted phase, however, this will not in general be true of the moving spins, and the residual precessing transverse magnetization arising from these spins can be detected and used to produce an image.

In carrying out the method, the time $2\tau$ must be much less than the longitudinal relaxation time whereby the application of a final RF pulse at time $2\tau$ identical to the initial RF pulse and with the proper phase will restore the statationary spins to their initial state aligned along the static field. The use of a gradient reversal requires the final RF pulse to be phase reversed from the initial RF pulse. Moving spins due to blood flow, for example, will be left with a transverse component which can then be identified by employing conventional NMR imaging techniques. Since velocity selection is achieved by gradient application between RF pulses, gradients applied during the RF pulses for the purpose of spatially selected excitation and after the final RF pulse for the purpose of imaging can be different from each other. This allows the flow sensing direction to be independent of the imaging direction even when spatially selective excitation is used.

The invention and objects and features thereof will be more readily apparent from the following detailed description and appended claims when taken with the drawing, in which:

FIGS. 3A-3E illustrate the refocusing and restoration of stationary nuclear spins.

FIGS. 4A-4E illustrate the effect of the sequence shown in FIG. 3 on moving nuclear spins in accordance with one embodiment of the invention.

FIG. 5 illustrates the timing diagram for magnetic gradients and RF pulses as employed in one embodiment of the invention.

Figure 1A:
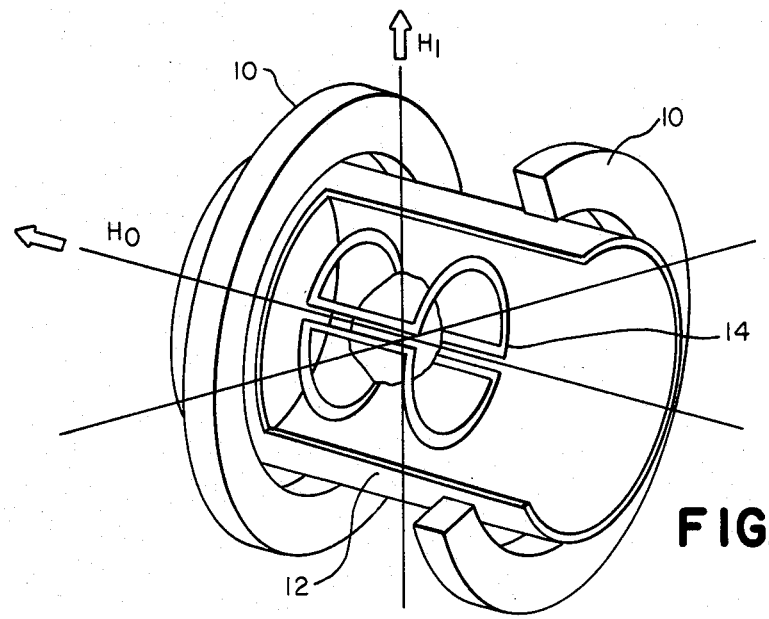
FIGS. 1A-1D illustrate the arrangement of NMR apparatus and magnetic fields generated therein.
Figures 1B, 1C, 1D:
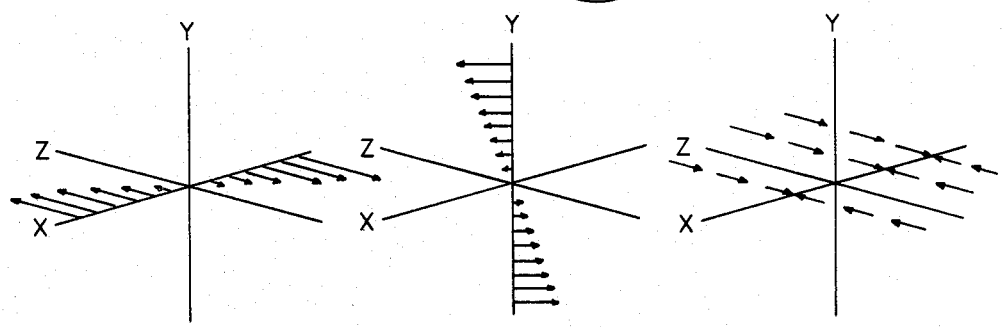

Referring now to the drawings, FIG. 1A is a perspective view partially in section illustrating coil apparatus in NMR imaging system, and FIGS. 1B-1D illustrate field gradients which can be produced in the apparatus of FIG. 1A. This apparatus is discussed by Hinshaw and Lent, "An Introduction to NMR Imaging: From the Bloch Equation to the Imaging Equation", *Proceedings of the IEEE*, Vol. 71, No. 3, March 1983 pgs. 338-350. Briefly, the uniform static field $B_o$ is generated by the magnetic source comprising the coil pair 10. A gradient field $G(x)$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

Figure 2:
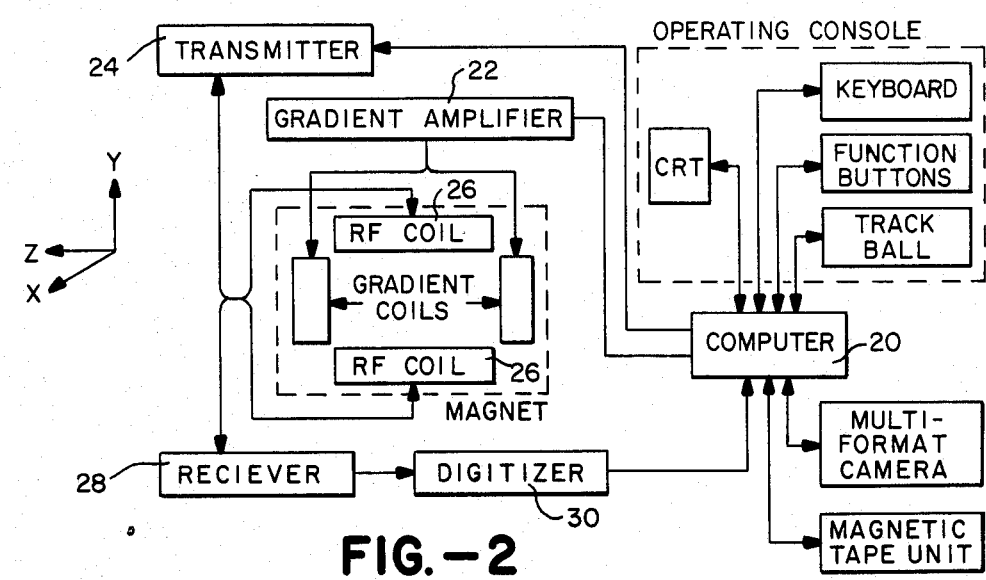
FIG. 2 is a functional block diagram of NMR imaging apparatus.

FIG. 2 is a functional block diagram of the imaging apparatus as disclosed in *NMR-A Perspective on Imaging*, General Electric Company 1982. A computer 20 is programmed to control the opeation of the NMR apparatus and process FID signals detected therefrom. The gradient field is energized by a gradient amplifier 22, and the RF coils for impressing a RF magnetic moment at the Larmor frequency is controlled by the transmitter 24 and the RF coils 26. After the selected nuclei have been flipped, the RF coils 26 are employed to detect the FID signal which is passed to the receiver 28 and thence throuh digitizer 30 for processing by computer 20.

In accordance with one embodiment of the invention, a pulse echo of nuclear spins is formed whereby the stationary spins can be restored to the original axis along $B_o$ and residual nuclear spins undergoing fluid flow can be identified. FIGS. 3A-3E and FIGS. 4A-4E illustrate one embodiment of the invention for static nuclear spins and moving nuclear spins, respectively.

In FIG. 3A nuclei are subjected to a static magnetic field along the Z axis producing a static magnetization $M_o$. An RF pulse is applied transverse to the static field, such as along the Y axis in FIG. 3A, which causes the nuclear spins to tilt by some angle (for example 90° to the X axis, as indicated). Assuming that nuclei in a planar slice are to be excited, then a gradient field will be superimposed along the static field and the RF pulse will be applied at the Larmor frequency for the nuclei in the desired plane. If fluid flow within a whole volume is to be identified, then the gradient is not required.

After the RF pulse is applied, a gradient field G, which specifies the velocity-sensing direction, is applied for a time period $\tau$, whereby the nuclear spins become dephased as shown in FIG. 3B. The time $\tau$, is selected to be less than the transverse relaxation time, $T_2$, and much less than the longitudinal relaxation time, $T_1$. A spin echo of the nuclear spins is then created by turning the partially dephased nuclear spins over in a mirror image position as shown in FIG. 3C. This can be accomplished by applying a 180° RF pulse thereto. Alternatively, as indicated previously, the spin echo can be produced by reversing the gradient field. After the flipping of dephased magnetic spins, the spins move to refocus as shown in FIG. 3D, and at time $2\tau$ the refocused static magnetic spins are restored along the Z axis by applying a restoration pulse which is identical to the initial RF pulse in FIG. 3A except when a reverse gradient is used to produce the spin echo in which case the restoration RF pulse is opposite to the initial RF pulse.

Dynamic or moving nuclear spins within the image plane or (or volume) will refocus as do the static nuclei spins but at a different azimuthal angle due to the changing position in the gradient applied to the spins between the RF pulses. This is illustrated in FIGS. 4A-4E which correspond in time to FIGS. 3A-3E, respectively. Thus, while the static spins are becoming refocused as shown in FIG. 3D, the moving nuclear spins due to blood flow or other fluid flow will have in general a component along the Y axis as illustrated in FIG. 4D. Thus, when the restoration pulse is applied, as shown in FIGS. 3E and 4E, a residual transverse nuclear moment will be present in the Y-Z plane axis as shown in FIG. 4E. The FID from the moving nuclear spins can then be detected to produce an image of the flow.

FIG. 5 illustrates the timing sequence showing the difference between the motion discrimination gradient, $G_M$, which is applied between RF pulses and the selective excitation gradient, $G_S$, which is applied during the RF pulses. The distinction between $G_M$ and $G_S$ is made to emphasize the fact that the flow-sensing direction (determined by $G_M$) and the imaging direction (determined by $G_S$ or the gradients applied subsequent to the final rf pulse during data acquisition) are independent of each other. The magnitude and direction of $G_S$ is the same during the initiating and terminating RF pulses but may differ during the 180° pulse depending on the imaging technique employed. The gradient $G_M$ need not be constant but the time dependence and the two interpulse intervals must be such as to produce a principal echo at a known time, e.g. $2\tau$. If spatially selective refocusing is not required, a gradient reversal can be used instead of the 180° pulse. In this case the final RF pulse will be in opposite direction from the initiating RF pulse.

The invention includes the exclusive imaging of nuclear spins having a non-zero macroscopic velocity component in an arbitrary specified direction without the imposition of any additional computational burden beyond that of the imaging process. The velocity sensing direction is independent of the imaging direction and therefore allows imaging of motion in as well as normal to the imaging direction. If slice-selective excitation is used and the velocity-sensing direction is normal to the slice plane, the spins which have moved into the slice in the interval beween the initial and the final rf pulses will produce a signal independently of the mechanism described here. If it is important to distinguish between the signals produced by these two mechanisms, it is possible to do so on the basis of the 90° phase difference that exists between the two types of signal.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of identifying fluid movement in a material comprising the steps of
   applying a static magnetic field to said material thereby aligning nuclear spins,
   applying a first RF magnetic pulse to said material thereby tilting said nuclear spins,
   applying a gradient field to said nuclei whereby said nuclear spins become dephased,
   refocusing said dephased nuclear spins,
   applying a restoration RF magnetic pulse to said nuclear spins upon refocusing of said nuclear spins, and
   identifying residual transverse nuclear moments in said material as indicative of moving nuclei.

2. The method as defined by claim 1 wherein said nuclei are selectively excited in a planar slice by means of further including the step of superimposing a gradient magnetic field on said static magnetic field, said first RF magnetic pulse being at the Larmor frequency for said planar slice.

3. The method as defined by claim 2 wherein said step of identifying residual nuclei spin includes detecting FID signals from said residual nuclear spins.

4. The method as defined by claim 3 and further including the step of selectively applying a gradient magnetic field to said residual nuclei spins during the detecting of FID signals to determine the location of nuclear movement.

5. The method as defined by claim 4 and further including the step of imaging said residual magnetic spins.

6. The method as defined by claim 1, wherein said step of identifying residual nuclear spins includes detecting FID signals from said residual nuclear spins.

7. The method as defined by claim 6 and further including the step of imaging said residual magnetic spins.

8. The method as defined by claim 1 wherein fluid movement is blood flow in a body.

9. Apparatus for identifying fluid movement in a material comprising
   means for applying a static magnetic field to said material,
   means for applying an RF magnetic pulse to said material thereby tilting nuclei spins in said material,
   means for applying a gradient field to said nuclei whereby said nuclear spins become dephased,
   means for refocusing said dephased nuclear spins to produce a spin echo,
   means for applying a restoration RF magnetic pulse to said nuclei spins upon refocusing of said nuclei spins of static nuclear, and
   means for identifying residual nuclear spins in said material indicative of moving nuclei.

10. Apparatus as defined by claim 9 wherein said nuclei are in a plane and further including means for superimposing a gradient magnetic field on said static magnetic field, said RF magnetic pulse being at the Larmor frequency for said plane.

11. Apparatus as defined by claim 10 wherein said means for identifying residual nuclei spins includes means for detecting FID signals from said residual nuclei spins.

12. Apparatus as defined by claim 11 and further including means for selectively applying a gradient field to said residual nuclei spins during the detecting of FID signals to thereby determine nuclear movement.

* * * * *